Figure 1:
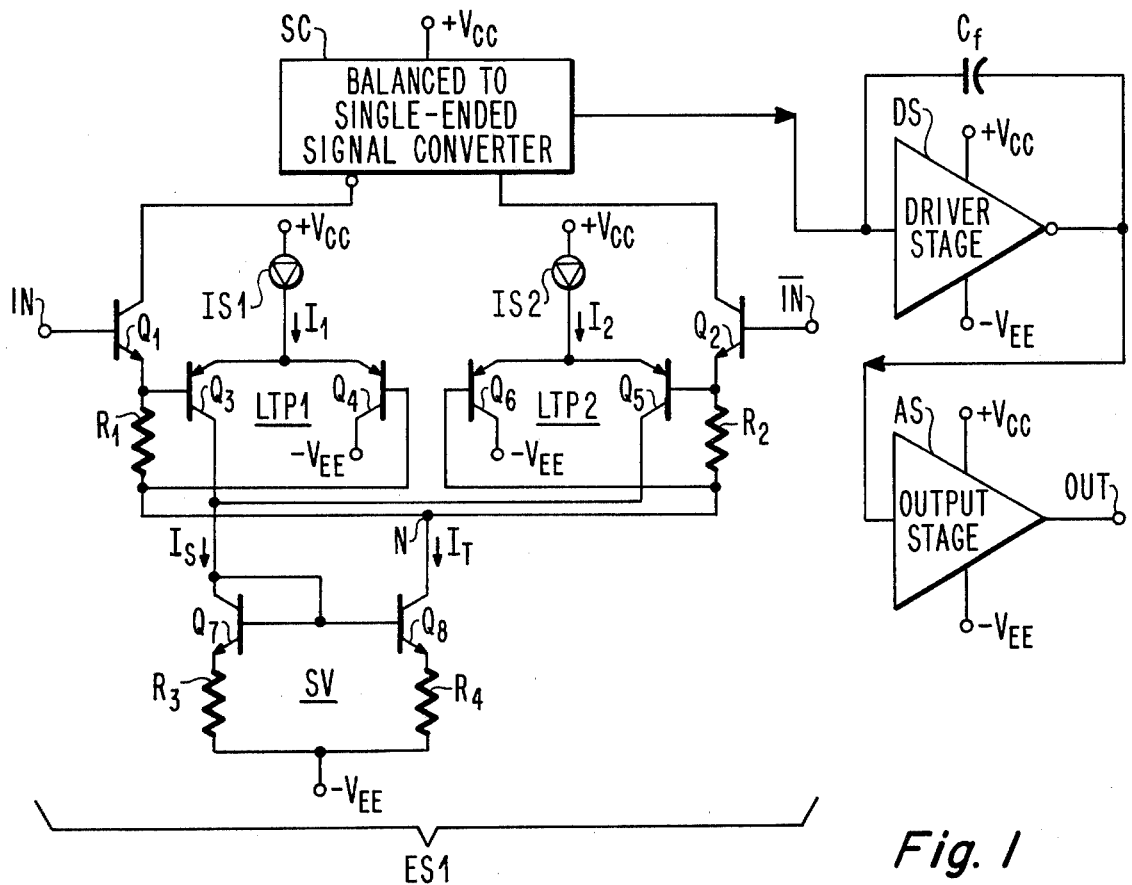

United States Patent [19]

Robe

[11] 4,075,575
[45] Feb. 21, 1978

[54] INPUT STAGE FOR FAST-SLEWING AMPLIFIER

[75] Inventor: Thomas Joseph Robe, Union, N.J.

[73] Assignee: RCA Corporation, New York, N.Y.

[21] Appl. No.: 775,867

[22] Filed: Mar. 9, 1977

[51] Int. Cl.² ............................................... H03F 3/45
[52] U.S. Cl. .................................... 330/259; 330/257; 330/361
[58] Field of Search .................... 328/128; 330/22, 26, 330/30 D, 69

[56] References Cited

U.S. PATENT DOCUMENTS 3,668,538   6/1972   Hearn .......................... 330/30 D X Primary Examiner—Lawrence J. Dahl
Attorney, Agent, or Firm—H. Christoffersen; A. L. Limberg

[57] ABSTRACT

When a reduction in the current flow through one transistor of a long-tailed pair connection of transistors is sensed under conditions where rapid slewing is desired, the supply of tail current is increased to increase the rate at which the long-tailed pair can change the charge on the capacitances of following stages.

14 Claims, 4 Drawing Figures

INPUT STAGE FOR FAST-SLEWING AMPLIFIER

The Government has rights in this invention pursuant to PO#037 - C90014 under contract N00030-74-C-0100 awarded by the Department of the Navy.

The present invention relates to an input stage for an operational amplifier that provides for fast slewing without concomitant increase in input offset current error.

In a conventional operational amplifier, the input stage is followed in cascade by driver and output stages. A feedback capacitor is used in a feedback connection of the output circuit of the driver stage to its input circuit so the stage operates as an integrator with a twenty db decrease in amplifier response per decade increase of signal frequency. The slew rate of the operational amplifier—that is, the speed with which it can follow a step in input signal —is limited by the amount of current available from the input stage to charge or to discharge the feedback capacitor.

In many prior art operational amplifiers, the input stage is operated with high quiescent current to increase the current available for charging or discharging the capacitor. Increased quiescent current levels in the input stage undesirably tend to increase the input currents demanded from the circuitry preceding the operational amplifier and to increase the input offset error of the operational amplifier when it is provided with direct-coupled overall feedback.

W. E. Hearn in U.S. Pat. No. 3,668,538 issued June 6, 1972, and entitled "Fast Slewing Operational Amplifier" discloses an improved input stage. In the Hearn input stage the transconductance of the input stage increases exponentially with applied input signal current, to make available almost boundless current for charging or discharging the feedback capacitor. This almost boundless current provides for greatly increased slew rate, but at the same time greatly increases the likelihood of saturation occurring in the transistors in the driver and output stages, which can undesirably slow the settling time of the operational amplifier—that is, the time for normal linear operation to be re-established after fast slewing.

The present invention is embodied in an amplifier input stage from which increased current is available to a subsequent stage during rapid input signal excursions, but which increased current has well-defined bounds so as to avoid adverse effect upon amplifier settling time.

Figure 2:
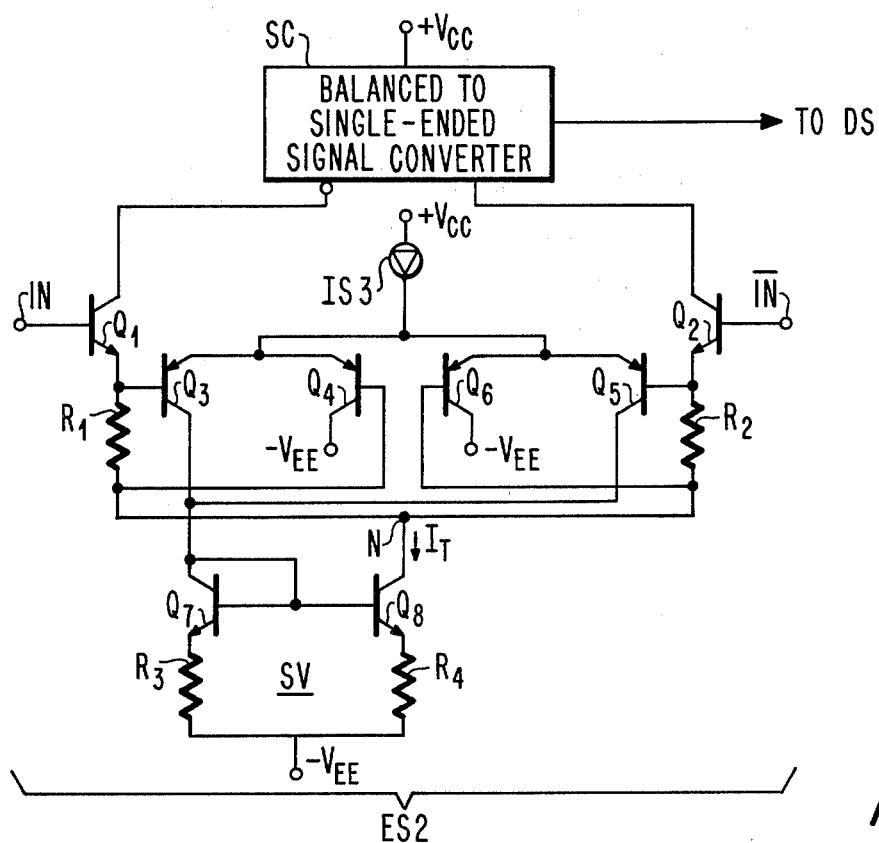
Figure 3:
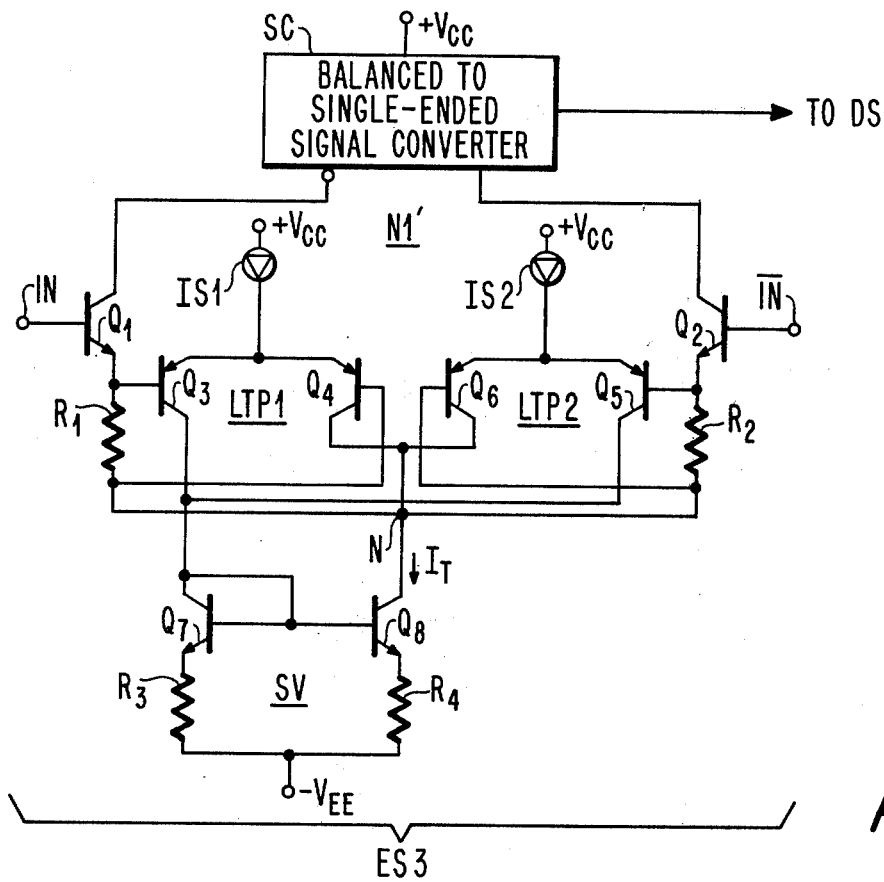
Figure 4:
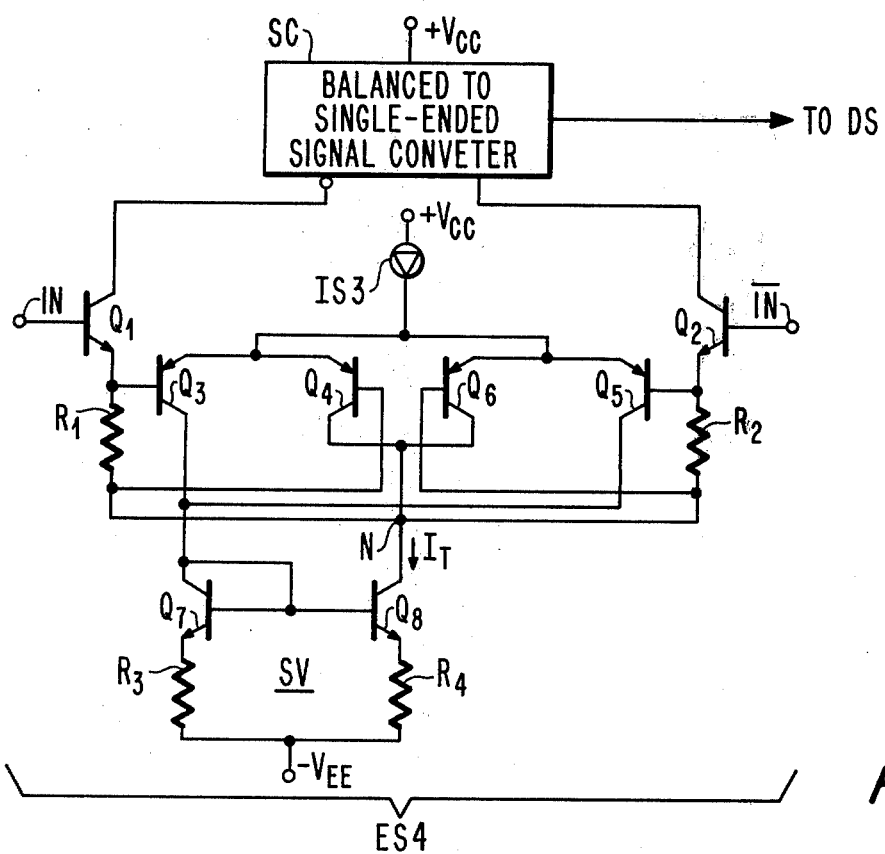

In the drawing:

FIG. 1 is a schematic diagram, partially in block form, of an operational amplifier having an input stage in which the present invention is embodied; and FIGS. 2, 3 and 4 are schematic diagrams, partially in block form, of input stages which are modifications of the FIG. 1 input stage and which embody the present invention.

The FIG. 1 operational amplifier is of a type suited to monolithic integrated construction. The operational amplifier is designed to be energized from a relatively negative operating voltage $-V_{EE}$ and a relatively positive operating voltage $+V_{CC}$ as compared to the quiescent potentials applied to its non-inverting and inverting input terminals labelled IN and $\overline{\text{IN}}$, respectively, IN and $\overline{\text{IN}}$ are at the base electrodes of NPN transistors $Q_1$ and $Q_2$, respectively, in the input stage ES1 of the operational amplifier. In the input stage ES1, the emitters of Q1 and Q1 are connected by resistors $R_1$ and $R_2$, respectively, to a node N from which a tail current $I_T$ is withdrawn; Q1 and Q2 are thus connected in classical long-tailed pair configuration. Q1 and Q2 demand collector currents with balanced variations responsive to difference in the input potentials applied between their base electrodes—that is, between the terminals IN and $\overline{\text{IN}}$.

Q1 and Q2 have their collectors connected to the inverting and non-inverting input terminals of a balanced-to-single-ended signal converter SC in which the balanced variations in the collector currents of Q1 and Q2 are differentially combined to provide an input signal for driver stage DS. SC typically is a current mirror amplifier constructed with PNP master and slave transistors. Driver stage DS typically is a transresistance amplifier of the inverting type reseptive of input signal current from input stage ES1 to supply an output signal potential. This signal potential is applied as input signal to an output stage AS, which responds to supply its own output signal at the output terminal OUT, which output signal is a varying potential in the case of a conventional voltage-amplifier type of operational amplifier.

In the FIG. 1 operational amplifier the dominant time constant is established by a Miller feedback capacitor $C_f$ connected between the output and input circuits of the drive stage DS. DS and $C_f$ form an integrator, integrating current from balanced-to-single-ended signal converter SC to provide input signal to output stage AS. It is assumed for purpose of the present description of the present invention that the slew rate of FIG. 1 operational amplifier is determined by the current available from the input stage ES1 to charge or discharge $C_f$. To obtain a rapid slew rate one wishes to increase $I_T$ whenever large differential-mode signal is applied between the input terminals IN and $\overline{\text{IN}}$. Under quiescent conditions, however, one wishes to keep $I_T$ at a lower level to reduce the emitter currents $I_{EQ1}$ and $I_{EQ2}$ of $Q_1$ and $Q_2$. This reduces the base currents $I_{BQ1}$ and $I_{BQ2}$ of $Q_1$ and $Q_2$ required to support $I_{EQ1}$ and $I_{EQ2}$ and so reduces input offset error.

In FIG. 1, a current source IS1 supplies a current to the interconnected emitter electrodes of PNP transistors Q3 and Q4 connected in a long-tailed pair configuration, LTP1, that functions as a current divider. The end of R1 at the emitter of Q1 and the end of R1 at node N are respectively connected to the base electrode of Q3 and to the base electrode of Q4. So the potential drop $V_{R1}$ appearing across $R_1$ under quiescent conditions (when the potentials at input terminals IN and $\overline{\text{IN}}$ are the same) biases transistor Q4 for substantially greater conduction than Q3. Similarly, a current source IS2 supplies a current to the interconnected emitter electrodes of PNP transistors Q5 and Q6 connected in a long-tailed pair configuration LTP2 that functions as a current divider. The ends of resistor $R_2$ at the emitter electrode of Q2 and at node N are respectively connected to the base electrode of Q5 and to the base electrode Q6, and the potential drop $V_{R2}$ appearing across $R_2$ under quiescent conditions biases transistor $Q_6$ to substantially greater conduction than $Q_5$. The collector currents of $Q_3$ and $Q_5$ are inverted and then combined, or combined and then inverted to provide $I_T$. The latter procedure is preferred since the collector currents are readily combined by interconnection between the collector electrodes $Q_3$ and $Q_5$ to provide a single current for inversion. FIG. 1 shows this interconnection of the collector electrodes of Q3 and Q5 and a current amplifier SV that functions as an inverting amplifier for inverting the combined collector currents of Q3 and Q5 to obtain an $I_T$ of proper polarity.

SV typically comprises a current mirror amplifier, which may take the form shown in FIG. 1. In FIG. 1, SV includes NPN master and slave transistors Q7 and Q8, respectively, and their respective emitter degeneration resistors $R_3$ and $R_4$. In SV the conductance of $R_4$ may be related to that of $R_3$ in the same ratio as the collector-current-versus-emitter-to-base voltage ($I_c$ vs. $V_{BE}$) characteristic of Q8 is related to that of Q7, in which case SV will have a constant current gain G equal to that ratio. One may prefer, however, for reasons to be explained to make the ratio of the conductance of $R_4$ to that of $R_3$ larger than the ratio of the $I_c$ vs. $V_{BE}$ characteristic of Q8 to that of Q7. In such case SV exhibits a current gain G' at relatively high input current levels, when the potential drops $V_{R3}$ and $V_{R4}$ across resistors $R_3$ and $R_4$ appreciably exceed the $V_{BE}$'s of Q7 and Q8, that is larger than the current gain G that SV exhibits at relatively low input current levels, when $V_{R3}$ and $V_{R4}$ are appreciably smaller than the $V_{BE}$'s of Q7 and Q8. Other forms of current mirror amplifiers may replace that shown in FIG. 1 and may incorporate modifications to cause them to exhibit different current gains at different levels, and indeed current amplifiers SV may simply consist of a common-emitter transistor.

Suppose now that the FIG. 1 operational amplifier is connected as a voltage follower with its output terminal OUT directly connected to its inverting input terminal $\overline{\text{IN}}$ and that it is called upon to slew rapidly. This request is in response to the potential $V_{IN}$ at the non-inverting input terminal IN being rapidly changed to be substantially positive compared to $V_{\overline{IN}}$ at the inverting input terminal $\overline{\text{IN}}$. This tends to make $Q_1$ conducting and $Q_2$ non-conducting. Responsive to the increase in $I_{EQ1}$, $V_{R1}$ increases, biasing Q3 for still more reduced conduction. Responsive to the reduction in $I_{EQ2}$, $V_{R2}$ decreases, decreasing to just the base current $I_{BQ5}$ of Q5, if $I_{EQ2}$ is reduced to zero. Q5 is no longer reduced in conduction with respect to Q6, assuming Q5 and Q6 to have similar $I_c$ vs. $V_{BE}$ characteristics. The current $I_V$ supplied by source IS2, which under quiescent conditions flows principally through Q6 and is thus diverted from the input connection of current amplifier SV, under the rapid slewing conditions flows in substantially increased proportion through Q5 to the input connection of SV. SV responds to demand increased $I_T$.

Since $I_{EQ2}$ is much reduced, this substantially increased current flows as increased IEQ1, causing Q1 to supply substantially increased collector current ICQ1. Balanced-to-single-ended signal converter SC responds to the substantially increased $I_{CQ1}$ to supply substantially increased current to driver stage DS and its Miller feedback capacitor $C_f$, which speeds up the response of the integrator comprising DS and $D_f$.

Rapid slewing for the conditions where $V_{IN}$ is suddenly made substantially negative with respect to $V_{\overline{IN}}$, on the other hand, results in $V_{R1}$ being reduced, permitting current $I_1$ from IS1 to flow in substantially increased proportion to the input connection of current amplifier SV1 to cause substantially increased $I_T$ demand. The substantially increased $I_T$ demand results in substantially increased $V_{R2}$ and $I_{EQ2}$. The substantially increased $I_{EQ2}$ causes $Q_2$ to demand correspondingly increased collector current $I_{CQ}$ from balanced-to-single-ended signal converter SC. SC responds to demand substantially increased current the integrator formed by driver stage DS and its Miller feedback capacitor $C_f$, speeding up the response of the integrator.

To avoid saturation conditions that undesirably lengthen the settling time of the operational amplifier, it is desirable that limits be placed on the currents available from the input stage during rapid slewing. In the FIG. 1 operational amplifier the maximum current available from input stage ES cannot exceed the sum of the currents $I_1 + I_2$ respectively supplied from current sources IS1 and IS2, multiplied by the current gain G of SV that obtains during rapid slewing conditions. Knowing the capacitance the input stage must charge and the rate at which the capacitance must be charged and assuming a convenient value for G, one can determine the required values of $I_1$1 $I_2$.

The quiescent value of $I_Q$ of the current flowing through $Q_1$ and $R_1$ and of the current flowing through $Q_2$ and $R_2$, is larger than the permitted quiescent input current demand by one plus the common-emitter forward current gain of transistors $Q_1$ and $Q_2$. The resistances of each of resistors $R_1$ and $R_2$ is chosen sufficiently larger than the internal emitter resistance of the transistor to which it connects to obtain the degree of transconductance linearization desired in the input stage $E_S$. Thus the values of the quiescent potential drops $V_{R1}$ and $V_{R2}$ across $R_1$ and $R_2$, respectively, can be calculated according to Ohm's Law to be $I_Q V_{R1}$ and $I_Q V_{R2}$, respectively.

Under quiescent conditions the tail current $I_T$ will have to be $2I_Q$. The currents $I_1$ and $I_2$ supplied from current sources IS1 and IS2, respectively, must be properly apportioned between Q3 and Q4, and between Q5 and Q6, respectively, to provide the input current $2I_Q/G$ to current amplifier SV that results in an output current $I_T = 2I_Q$. Deciding how this apportionment is to be made determines $I_{CQ3}/I_{CQ4}$ and $I_{CQ5}/I_{CQ6}$.

The division of current in a long-tailed pair of transistors is governed by the potential applied between the base electrodes of the transistors. Derivation of the relationship is from the well-known transistor equation following.

$$V_{BE} = (kT/q) \ln (I_C/AJ_S) \tag{1}$$

wherein $V_{BE}$ is the transistor emitter-to-base potential,
$k$ is Boltzmann's constant,
$T$ is the absolute temperature of the transistor,
$q$ is the charge on an electron,
$I_C$ is the transistor collector current,
$A$ is the effective area of the transistor base-emitter junction, and
$AJ_S$ is the collector current of the transistor when its $V_{BE} = 0$.

The integrated transistors Q3, Q4, Q5, Q6 are assumed to have similar junction profiles and thus similar $J_S$'s and to operate at the same temperature T; $V_{BE}$, $I_C$, and A are subscripted with the reference numeral of the transistor with which they are associated.

$$V_{BEQ3} = (kT/q)\ln(I_{CQ3}/A_{Q3}J_S) \tag{2}$$

$$V_{BEQ4} = (kT/q)\ln(I_{CQ4}/A_{Q4}J_S) \tag{3}$$

Dual identify 4 can be written applying Ohm's Law and Kirchoff's Law of Voltages.

$$V_{R1} = I_Q R_1 = V_{BEQ4} - V_{BEQ3} \tag{4}$$

$$(A_{Q3}/A_{Q4}) = (I_{CQ3}/I_{CQ4}) \exp(q\, I_Q R_1 / kT) \quad (5)$$

By similar derivation the value of $A_{Q5}/A_{Q6}$ can be shown to be as set forth in equation 6, following.

$$(A_{Q5}/A_{Q6}) = (I_{CQ5}/I_{CQ6}) \exp(q I_Q R_2 / kT) \quad (6)$$

In the design procedure, then, usually one will adjust the $A_{Q3}/A_{Q4}$ and $A_{Q5}/A_{Q6}$ ratios to accommodate the previous design choices.

While the operation of the FIG. 1 input stage ES1 can be described considering the long-tailed pair configuration LTP1 comprising Q3, A4, IS1 and the long-tailed pair configuration LTP1 comprising Q5, Q6, IS2 as being controlled current dividers, one may alternatively consider LTP1 and LTP2 as voltage comparators. LTP1 compares the voltages at the ends of $R_1$ to each other to apply a relatively small current to the input connection of current amplifier SV when their difference $V_{R1}$ is substantial responsive to conduction of $Q_1$, and a relatively large current to SV when the voltages at the ends of $R_1$ are substantially alike responsive to substantially reduced conduction of $Q_1$. LTP2 compares the voltages at the ends of $R_2$ to each other to apply a relatively small current to the input connection of current amplifier SV when their difference $V_{R2}$ is substantial, responsive to conduction of $Q_2$, and a relatively large current to SV when the voltages at the ends of $R_2$ are substantially alike, responsive to substantially reduced conduction of $Q_2$. Note that decreased conduction of $Q_1$ is responsible for increased availability of current to $Q_2$ and that decreased conduction of $Q_2$ is responsible for increased availability of current to $Q_1$.

FIG. 2 shows an input stage ES2 that may be advantageously used in place of ES1. The ES2 input stage uses a single current source IS3 to supply current to an interconnection of all the emitter electrodes of Q3, Q4, Q5 and Q6. Under quiescent conditions, if the current supplied by IS3 in FIG. 2 is twice as large as each of the currents supplied by IS1 and IS2 in FIG. 1, the input stages in ES1 and ES2 is FIGS. 1 and 2 have substantially corresponding current flows and potentials in the corresponding portions of the rest of their respective circuitry. During rapid slewing, however, rather than just substantially all of the current from only one of IS1 or IS2 being available for application to the input connection of SV, substantially all the current from IS3 is available. So an operational amplifier using ES2 input stage has twice the slew rate capability of the FIG. 1 operational amplifier for similar quiescent current levels (and, thus, for similar input offset current errors).

As shown in FIG. 3, one can modify the FIG. 1 input stage ES1 to apply the collector currents of Q4 and Q6 to supply a portion of $I_T$ under quiescent conditions, providing that the current gain G of current amplifier SV is large enough that $I_T$ exceeds the collector currents of Q4 and Q6. FIG. 4 shows similar modification of the FIG. 2 input stage ES2. These modifications increase the current available for application to the driver stage DS under rapid slewing conditions, as compared to $I_Q$.

While the resistors $R_1$ and $R_2$ used to sense the currents flowing through the principal conduction paths of Q1 and Q2 are shown as being connected in the emitter circuits of Q1 and Q2, $R_1$ and $R_2$ may instead be connected in the collector circuits of Q1 and Q2 and the emitters of Q1 and Q2 directly interconnected without intervening resistance. This may be done, for example, because one desires the maximum transconductance of Q1 and Q2 for a given quiescent current level. With $R_1$ and $R_2$ located as shown in FIGS. 2 and 4, $Q_4$ and $Q_6$ are in parallel connection and may therefore be replaced by a single equivalent transistor.

Certain types of current sources lend themselves particularly well for use as IS1 and IS2 in the FIGS. 1 and 3 configurations in FIGS. 2, 4, 5 and 6 configurations. These current sources are those having currents that depend upon temperature in such a way that applied in some fraction to resistor $R_1$ or $R_2$, a voltage drop proportional to the absolute temperature of the transistors results. The use of such current reduces the effect of temperature upon the ratio of current available from the input stage during slewing to the quiescent current levels in the input stage, since potentials drops across $R_1$ and $R_2$ so proportional to absolute temperature provide for temperature-independent current division between $Q_5$ and $Q_6$ and between $Q_7$ and $Q_8$ when two current sources IS1 and IS2 are used—or between $Q_5$ and $Q_7$ when a single current source IS3 is used.

Representative current sources of the preferred type are described by C. F. Wheatley, Jr. in U.S. Pat. No. 3,629,691 issued Dec. 21, 1971, and entitled "Current Source" and by B. Crowle in U.S. Pat. No. 4,063,149 issued Dec. 13, 1977, entitled "Current Regulating Circuits".

Improving the slew rate in accordance with the present invention is advantageous over Hearn also in that additional sources or sinks of current responsive to $I_T$ are readily provided by slaving further transistors in parallel with Q8. A source or sink of current that increases with the need for rapid slewing can be used in the driver or output stage of an operational amplifier to reduce the pull-up or pull-down time associated with changing the voltage at a node.

The present invention may be practiced using field effect transistors (FET's) in place of certain of its junction transistors and the scope of the following claims should be accordingly construed with "base electrode," "emitter electrode" and "collector electrode" being considered as also being descriptive of the gate, source and drain electrodes, respectively, of a FET. The "normal transistor mode" is that mode of operation wherein there is no bottoming of the output circuit of the current amplifying device—e.g., no saturation with its attendant forward current over the collector-base junction, when the current amplifying device is a bipolar transistor.

What is claimed is:

1. A fast-slewing multi-stage amplifier having, in cascade connection, an input stage and stage and at least one succeeding amplifier stage with associated capacitance, the charge on which capacitance must be changed during slewing, wherein said input stage comprises:

first and second transistors of a first conductivity type, each having emitter and collector electrodes and a principal conduction path therebetween and having a base electrode;

means connecting said first and second transistors in long-tailed pair configuration including:

means for applying a first input potential to the base electrode of said first transistor;

means for applying a second input potential to the base electrode of said second transistor; and a controlled source of tail current connected to an interconnection between the emitter electrodes of said first and said second transistors;

and means responsive to decreased current flowing in the principal conduction path of said first transistor to apply a control signal to said controlled source of tail current to increase said tail current.

2. A fast-slewing multi-stage amplifier having, in cascade connection, an input amplifier stage and at least one succeeding amplifier stage with associated capacitance the charge on which capacitance must be changed during slewing, wherein said input stage comprises:
   first and second transistors of a first conductivity type, each having emitter and collector electrodes and a principal conduction path therebetween and having a base electrode;
   means connecting said first and second transistors in long-tailed pair configuration including:
   means for applying a first input potential to the base electrode of said first transistor;
   means for applying a second input potential to the base electrode of said second transistor; and
   a controlled source of tail current connected to an interconnection between the emitter electrodes of said first and said second transistors;
   and means responsive to decreased current flowing in the principal conduction path of either of said first and said second transistors to apply a control signal to said controlled source of tail current to increase said tail current.

3. A fast-slewing multi-stage amplifier having, in cascade connection, an input amplifier stage and at least one succeeding amplifier stage with associated capacitance, the charge on which capacitance must be changed during slewing, wherein said input amplifier stage comprises:
   first and second transistors of a first conductivity type, each having a base electrode and each having emitter and collector electrodes and a principal conduction path therebetween;
   means for applying a first input potential to the base electrode of said first transistor and a second input potential to the base electrode of said second transistor, said input potentials having respective quiescent levels;
   means for applying collector potentials to said first and said second transistors for conditioning them to operate in the normal transistor mode, including means for applying the collector current variations of said first transistor to the amplifier stage immediately succeeding said input amplifier stage in said cascade connection;
   a first resistor connected to sense the flow of current through the principal conduction path of said first transistor for developing a potential drop across said first resistor proportional to the current it senses;
   means for applying a current to an interconnection between the emitter electrodes of said first and said second transistors, which current is of a polarity such as to tend to cause conduction of said first and said second transistors, which means includes first slew-rate improvement means, responsive to decrease in the potential drop across said first resistor from that appearing with quiescent levels of said input potentials, for increasing the current applied to the interconnection of the emitter electrodes of said first and second transistors, thereby to increase the flow of current through the principal conduction path of said second transistor.

4. A fast-slewing multi-stage amplifier as set forth in claim 3 wherein said means for applying a current and said first slew-rate improvement means together comprise:
   third and fourth transistors of a second conductivity type complementary to said first conductivity type, each having base and emitter and collector electrodes;
   means connecting said third and said fourth transistors in long-tailed pair configuration, including
   means applying the potential drop across said first resistor between the base electrodes of said third and said fourth transistors, and including
   a constant current generator connected to an interconnection between the emitter electrodes of said third and said fourth transistors for applying the emitter currents of said third and said fourth transistors; and
   an inverting amplifier having an input connection to which the collector electrodes of said third transistor is connected and having an output connection connected to the interconnection between the emitter electrodes of said first and said second transistors.

5. A fast-slewing multi-stage amplifier as set forth in claim 4 wherein the collector electrode of said fourth transistor is connected to the interconnection between the emitter electrodes of said first and said second transistors.

6. A fast-slewing multi-stage amplifier as set forth in claim 3 having:
   a second resistor connected to sense the flow of current through the principal conduction path of said second transistor for developing a potential drop across said second resistor proportional to the current it senses; and
   second slew-rate improvement means included in said means for supplying a current to an interconnection between the emitter electrodes of said first and said second transistors, said second slew-rate improvement means being responsive to decrease in the potential drop across said second resistor from that appearing with quiescent levels of said input currents for increasing the current applied to the interconnection of the emitter electrodes of said first and said second transistors, thereby to increase the flow of current through the principal conduction path of said first transistor.

7. A fast-slewing multi-stage amplifier as set forth in claim 6 wherein said means for applying a current and said first and said second slew-rate improvement means together comprises:
   third and fourth and fifth and sixth transistors of a second conductivity type complementary to said first conductivity type, each having base and emitter and collector electrodes;
   means connecting said third and said fourth transistors in a first long-tailed pair configuration, including:
   means applying the potential drop across said first resistor between the base electrodes of said third and said fourth transistors, and including
   a first constant current generator connected to an interconnection between the emitter electrodes of said third and said fourth transistors for supplying the emitter currents of said third and said fourth transistors;

means connecting said fifth and said sixth transistors in a second long-tailed pair configuration, including means applying the potential drop across said second resistor between the base electrodes of said fifth and said sixth transistors, and including;

a second constant current generator connected to an interconnection between the emitter electrodes of said fifth and said sixth transistors for supplying the emitter currents of said fifth and said sixth transistors, and an inverting amplifier having an input connection to which the collector electrodes of said third and said fifth transistors are connected and having an output connection connected to the interconnection between the emitter electrodes of said first and said second transistors.

8. A fast-slewing multi-stage amplifier as set forth in claim 7 wherein the collector electrodes of said fourth and said sixth transistors are connected to the output connection of said inverting amplifier.

9. A fast-slewing multi-stage amplifier as set forth in claim 6 wherein said first resistor and said second resistor connect the emitter electrodes of said first and said second transistors, respectively, to said interconnection between the emitter electrodes of said first and said second transistors.

10. A fast-slewing multi-stage amplifier as set forth in claim 6 wherein said means for applying a current and said first and said second slew-rate improvement means together comprise:

third and fourth and fifth and sixth transistors of a second conductivity type complementary to said first conductivity type, each having base and emitter and collector electrodes;

a constant current generator connected to an interconnection of the emitter electrodes of said third and fourth and fifth and sixth transistors;

means applying the potential drop across said first resistor between the base electrodes of said third and said fourth transistors;

means applying the potential drop across said second resistor between the base electrodes of said fifth and said sixth transistors;

means for applying collector potentials to said fourth and said sixth transistors for conditioning them to operate in the normal transistor mode; and an inverting amplifier having an input connection to which the collector electrodes of said third and said fifth transistors are connected and having an output connection connected to the interconnection between the emitter electrodes of said first and said second transistors.

11. A fast-slewing multi-stage amplifier as set forth in claim 10 wherein said means for applying collector potentials to said fourth and said sixth transistors includes connections of the collector electrodes of said fourth and said sixth transistors to the output connection of said inverting amplifier.

12. A fast-slewing multi-stage amplifier as set forth in claim 10 wherein said first resistor and said second resistor connect the emitter electrodes of said first and said second transistors, respectively, to said interconnection between the emitter electrodes of said first and said second transistors.

13. A fast-slewing multi-stage amplifier as set forth in claim 6 wherein said first and said second resistors connect the emitter electrodes of said first and said second resistors, respectively to said interconnection between the emitter electrodes of said first and said second transistors; and wherein said means for applying a current and said first and said second slew-rate improvement means together comprise:

third and fourth and fifth transistors of a second conductivity type complementary to said first conductivity type, each having base and emitter and collector electrodes;

a constant current generator connected to an interconnection between the emitter electrodes of said third and said fourth and said fifth transistors for supplying the emitter currents of said third, said fourth and said fifth transistors;

means applying the potential drop across said first resistor between the base electrodes of said third and said fifth transistors;

means applying the potential drop across said second resistor between the base electrodes of said fourth and said fifth transistors;

means for applying collector potential to said fifth transistor for conditioning it to operate in the normal transistor mode; and an inverting amplifier having an input connection to which the collector electrodes of said third and said fourth transistors are connected and having an output connection connected to the interconnection between the emitter electrodes of said first and said second transistors.

14. A fast-slewing multi-stage amplifier as set forth in claim 13 wherein said means for applying collector potential to said fifth transistor includes a connection of the collector electrode of said fifth transistor to the output connection of said inverting amplifier.

* * * * *

UNITED STATES PATENT OFFICE
CERTIFICATE OF CORRECTION

PATENT NO. : 4,075,575

DATED : February 21, 1978

INVENTOR(S) : Thomas Joseph Robe

It is certified that error appears in the above-identified patent and that said Letters Patent are hereby corrected as shown below:

| | |
|---|---|
| Column 1, line 67 | "Q1" (second occurrence) should be ---Q2--- |
| Column 2, line 58 | "Q6" should be preceded by ---of--- |
| Column 2, line 65 | "Q3" should be preceded by ---of--- |
| Column 3, line 25 | "amplifiers" should be ---amplifier--- |
| Column 3, line 56 | "$D_f$" should be ---$C_f$--- |
| Column 4, line 15 | "$I_1 I_2$" should be ---$I_1$ and $I_2$--- |
| Column 4, line 25 | "$E_\beta$" should be ---$E_S$--- |
| Column 4, line 64 | "identify" should be ---identity--- |
| Column 5, line 12 | "A4" should be ---Q4--- |
| Column 5, line 13 | "LTP1" should be ---LTP2--- |
| Column 5, line 40 | "is" should be ---in--- |
| Column 6, line 11 | "current" should be followed by ---sources--- |
| Column 6, line 50 | "an input stage and stage" should be ---an input amplifier stage--- |

UNITED STATES PATENT OFFICE
CERTIFICATE OF CORRECTION

PATENT NO. : 4,075,575

DATED : February 21, 1978

INVENTOR(S) : Thomas Joseph Robe

It is certified that error appears in the above-identified patent and that said Letters Patent are hereby corrected as shown below:

Column 8, line 16   "applying" should be ---supplying---

Signed and Sealed this

Twenty-fifth Day of July 1978

[SEAL]

Attest:

RUTH C. MASON
*Attesting Officer*

DONALD W. BANNER
*Commissioner of Patents and Trademarks*